United States Patent
Son et al.

(10) Patent No.: US 7,751,507 B2
(45) Date of Patent: Jul. 6, 2010

(54) ANALOG VITERBI DECODER

(75) Inventors: Hong-rak Son, Suwon-si (KR); Hyun-jung Kim, Jeonju-si (KR); Hyong-suk Kim, Jeonju-si (KR); Jeong-won Lee, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 812 days.

(21) Appl. No.: 11/487,469

(22) Filed: Jul. 17, 2006

(65) Prior Publication Data

US 2007/0047677 A1 Mar. 1, 2007

(30) Foreign Application Priority Data

Aug. 25, 2005 (KR) .................. 10-2005-0078165

(51) Int. Cl.
*H03D 1/00* (2006.01)
(52) U.S. Cl. .................. 375/341; 369/59.22; 714/795; 714/796
(58) Field of Classification Search .......... 714/795, 714/796; 369/59.2
See application file for complete search history.

(56) References Cited

U.S. PATENT DOCUMENTS

| | | | | |
|---|---|---|---|---|
| 4,087,787 A | * | 5/1978 | Acampora | .............. 714/795 |
| 4,606,027 A | * | 8/1986 | Otani | .............. 714/795 |
| 4,905,317 A | * | 2/1990 | Suzuki et al. | .............. 341/51 |
| 5,027,374 A | * | 6/1991 | Rossman | .............. 375/341 |
| 5,150,369 A | * | 9/1992 | Costa et al. | .............. 714/796 |
| 5,430,768 A | * | 7/1995 | Minuhin et al. | .............. 375/340 |
| 5,448,583 A | * | 9/1995 | Miyamoto et al. | .............. 714/795 |
| 5,579,340 A | * | 11/1996 | Tokuriki et al. | .............. 375/232 |
| 6,188,735 B1 | * | 2/2001 | Soichi et al. | .............. 375/341 |
| 2001/0050624 A1 | * | 12/2001 | Nagaraj | .............. 341/122 |
| 2002/0199154 A1 | * | 12/2002 | Son et al. | .............. 714/795 |

FOREIGN PATENT DOCUMENTS

EP 1043839 A2 10/2000
KR 2002-0096621 A 12/2002

* cited by examiner

*Primary Examiner*—Matthew D Anderson
*Assistant Examiner*—Erica Fleming-Hall
(74) *Attorney, Agent, or Firm*—Sughrue Mion, PLLC

(57) ABSTRACT

A circular Viterbi decoder is capable of improving a data decoding speed without being limited by a sampling speed of a sampling and holding circuit. An analog Viterbi decoder includes: a clock divider which generates a plurality of clock signals by dividing a clock frequency of an externally-input clock signal, a plurality of sampling and holding units which sample and hold input analog data according to the clock signals generated from the clock divider, and a multiplexer which sequentially and alternately outputs the analog data sampled and held by the sampling and holding units.

6 Claims, 6 Drawing Sheets

{ —— : IF INPUT IS "0"
{ ---- : IF INPUT IS "1"

ANALOG VITERBI DECODER

CROSS-REFERENCE TO RELATED APPLICATIONS

This application claims priority from Korean Patent Application No. 10-2005-0078165, filed Aug. 25, 2005 in the Korean Intellectual Property Office, the entire contents of which are incorporated herein by reference.

BACKGROUND OF THE INVENTION

1. Field of the Invention

The present invention relates to a Viterbi decoder decoding data using a trellis diagram, and more particularly, to a Viterbi decoder capable of improving a data decoding speed without being limited by a sampling speed of a sampling and holding circuit.

2. Description of the Related Art

With the development of communication technology, wireless mobile communication technology has been popularized throughout the world. Since data is wirelessly transmitted and received in the wireless mobile communication environment, a receiver cannot precisely receive data from a transmitter. In other words, data may be distorted during the transmission of the data due to noise or like.

In general, the transmitter codes and transmits data to be transmitted, and the receiver decodes the coded data so as to reduce the possibility of the data being distorted. Also, coding and decoding operations are performed in a process of storing data in a recording medium such as a digital versatile disk (DVD).

Examples of such a coding method include a block coding method, a convolution coding method, and the like. In the block coding method, an input data bit including additional data having a predetermined bit size is coded. In the convolution coding method, previously input data is stored in a memory so as to be coded based on a relationship between a current input value and a previous input value. The convolution coding method has higher error correction efficiency than the block coding method and thus is generally used.

A Viterbi decoder decodes data coded using the convolution coding method. Such a Viterbi decoder performs a several-step operation to determine an optimum path from accumulated result values so as to correct an error.

FIG. 1 is a view illustrating a trellis diagram used in a general Viterbi decoder. In the trellis diagram shown in FIG. 1, a constraint length is 3, and a coding rate is ½. Since the constraint length is 3, a previous input value may be 00, 10, 01, and 11. The Viterbi decoder back-tracks an optimum path in which an accumulated distance value is minimum after a predetermined period of time using a difference between a peculiar code allotted to each branch on the trellis diagram and a input signal as a metric. In detail, if the optimum path passes branches marked with solid lines, the Viterbi decoder decodes the input signal as 0. If the optimum path passes branches marked with dotted lines, the Viterbi decoder decodes the input signal as 1. Thus, if the input signal is different from a substantially transmitted signal, an error can be corrected.

Nodes a, b, c, and d on the trellis diagram compute the shortest distance reaching a destination using Equation 1:

$$D_{i,j} = \min\{D_{k,l} + d_{ij,kl}, (k,l) \in S(i,j)\} \quad (1)$$

wherein $D_{k,l}$ denotes the shortest distance from a $(k,l)^{th}$ cell to a destination, $d_{ij,kl}$ denotes a partial distance from a $(i,j)^{th}$ cell to a $(k,l)^{th}$ cell, $S(ij)$ denotes a set of cells around the $(i,j)^{th}$ cell, and min denotes a function outputting a minimum value of enumerated items.

The conventional Viterbi decoder does not realize all nodes on the trellis diagram as hardware but realizes only nodes in a column as hardware. Thus, these nodes performs the operation shown in Equation 1 above with time, i.e., adds a distance value of each branch to accumulated distance values transmitted from previous nodes, and selects a minimum value from the addition results so as to store the selection result in a memory. As a result, if an operation is performed up to a last destination, the conventional Viterbi decoder searches for an optimum path using data stored in the memory. Accordingly, the conventional Viterbi decoder requires additional hardware such as a memory. Also, a back-tracking process must be performed to compute the optimum path in the memory. Thus, decoding time is increased.

To solve these problems, a circular Viterbi decoder disposing cells in positions corresponding to nodes of a trellis diagram and connecting cells corresponding to last processing nodes to cells corresponding to first processing nodes has been developed as disclosed in Korea Registration No. 10-0412934. A conventional circular Viterbi decoder will now be schematically described with reference to FIG. 2. The conventional circular Viterbi decoder includes a decoder 10, an analog data storage 20, a first switch 30, a controller 40, and a sampling and holding unit 50.

The decoder 10 includes a plurality of processing nodes including a plurality of cells vertically disposed to correspond to nodes on a trellis diagram and decodes analog input data using an analog signal processing cell having a circular connection structure in which a last processing node of the plurality of processing nodes is connected to a first processing node.

The analog data storage 20 includes a plurality of condensers, stores analog data input through the sampling and holding unit 50, and transmits the data to the decoder 10 under the control of the controller 40.

The controller 40 controls the first switch 30 according to a predetermined clock signal CLK input from an external source to stores an analog input signal sampled and held by the sampling and holding unit 50 in the analog data storage 20.

The sampling and holding unit 50 samples and holds the analog input signal according to a clock signal CLK having the clock frequency as the clock signal CLK input to the controller 40.

The conventional circular Viterbi decoder does not need to store an output value of each cell doe in an additional memory and thus does not need to include additional hardware. Also, the conventional circular Viterbi decoder applies a predetermined trigger signal to each cell, senses a variation in a lastly output pulse, and performs decoding. Thus, the conventional circular Viterbi decoder does not require a back-tracking process. As a result, decoding time is reduced.

However, since the conventional circular Viterbi decoder adopts one sampling and holding circuit, the conventional Viterbi decoder cannot operate at a speed higher than a sampling speed at which the one sampling and holding circuit can precisely sample and hold an analog input signal. In other words, a decoding speed of the conventional circular Viterbi decoder is limited by the sampling speed of the sampling and holding circuit.

SUMMARY OF THE INVENTION

Illustrative, non-limiting embodiments of the present invention overcome the above disadvantages and other disadvantages not described above. Also, the present invention is not required to overcome the disadvantages described above, and an illustrative, non-limiting embodiment of the present invention may not overcome any of the problems described above.

The present invention provides a circular Viterbi decoder capable of improving a data decoding speed without being limited by a sampling speed of a sampling and holding circuit. According to an aspect of the present invention, there is provided an analog Viterbi decoder, comprising a clock divider which generates a plurality of clock signals by dividing a clock frequency of an externally-input clock signal, a plurality of sampling and holding units which sample and hold input analog data according to the clock signals generated from the clock divider, and a multiplexer which sequentially and alternately outputs the analog data sampled and held by the sampling and holding units.

The sampling and holding units may comprise a first sampling unit and a second sampling unit parallel arranged with respect to the first sampling unit.

The clock divider may generate a first clock signal by dividing the clock frequency into ½ and a second clock signal by inverting the first clock signal, and the first sampling and holding unit may sample and hold the externally-input analog data according to the first clock signal, and the second sampling and holding unit may sample and hold the externally-input analog data according to the second clock signal.

The multiplexer may sequentially and alternately output the analog data sampled and held by the first and second sampling and holding units, according to one of the first and the second clock signals.

A decoder may also be provided, which comprises a plurality of processing nodes, each of the plurality of processing nodes comprising a plurality of cells vertically disposed so as to correspond to nodes on a trellis diagram, the decoder being configured to decode analog input data using an analog signal processing cell having a circular connection structure in which a last processing node of the plurality of processing nodes is connected to a first processing node.

The decoder may comprise a cell selector which designates a predetermined cell of cells of a processing node designated by the controller, a second switching unit which are connected to each of the processing nodes of the analog signal processing cell so as to supply a reference input signal to the predetermined cell designated by the controller and the cell selector, a maximum value operator which detects a maximum value of output values of the cells if the cells of the designated processing node output predetermined operation values using the reference input signal and a value input from a previous processing node, a third switching unit which detects an output signal of the maximum value operator, a signal conversion detector which monitors an output signal output from the third switching unit to detect a variation in the output value, and a pulse generator which outputs the variation in the output value detected by the signal conversion detector in a pulse signal form.

Cells of a predetermined processing node of the decoder may operate the output value using equations below:

$$y_{i,j} = \max\{u_{i,j}, y_{k,l} - d_{ij,kl}; (k,l) \in S(i,j)\}$$

$$y_{i,j} = I_{ref} - D_{i,j}$$

$u_{i,j} = I_{ref}$; if (i,j) is cell of destination $u_{i,j} = 0$; if (i,j) is not cell of destination wherein $y_{i,j}$ denotes an output value of a $(i,j)^{th}$ cell, $D_{i,j}$ denotes a shortest distance from the $(i,j)^{th}$ cell to a destination cell, $I_{ref}$ denotes a reference input signal value, $d_{ij,kl}$ denotes a partial distance from the $(i,j)^{th}$ cell to a $(k,l)_{th}$ cell, $S(i,j)$ denotes a set of cells belonging to a processing node to which the $(i,j)^{th}$ cell belongs, and max denotes a function outputting a maximum value.

BRIEF DESCRIPTION OF THE DRAWINGS

The above and other aspects of the present invention will be more apparent by describing certain exemplary embodiments of the present invention with reference to the accompanying drawings, in which.

DETAILED DESCRIPTION OF THE EXEMPLARY EMBODIMENTS

Figure 1:
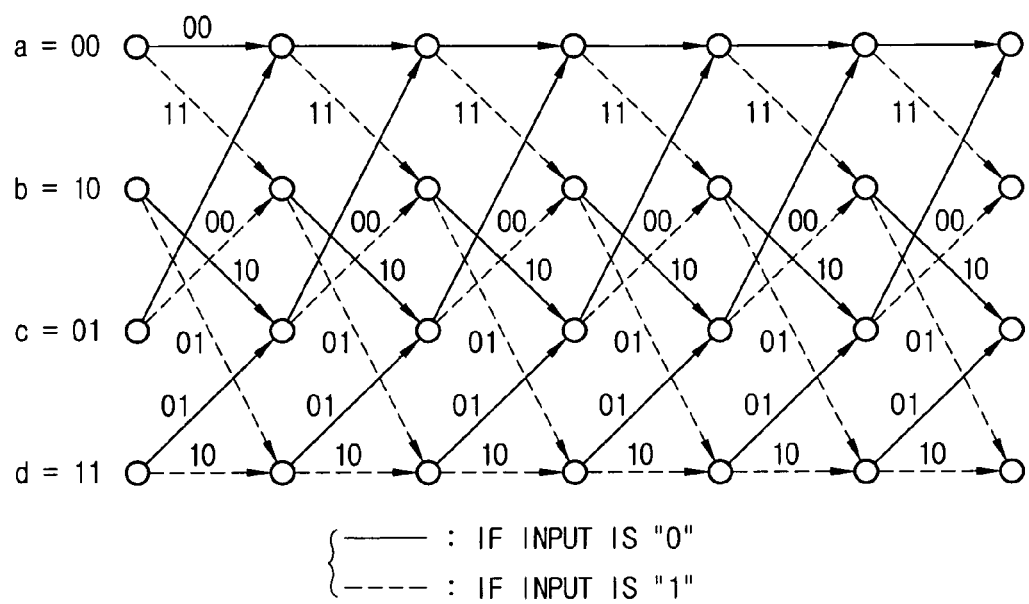
FIG. 1 is a view illustrating a trellis diagram used in a general Viterbi decoder.

Certain exemplary embodiments of the present invention will be described in greater detail with reference to the accompanying drawings.

In the following description, same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail so as to not obscure the invention in unnecessary detail.

Figure 3:
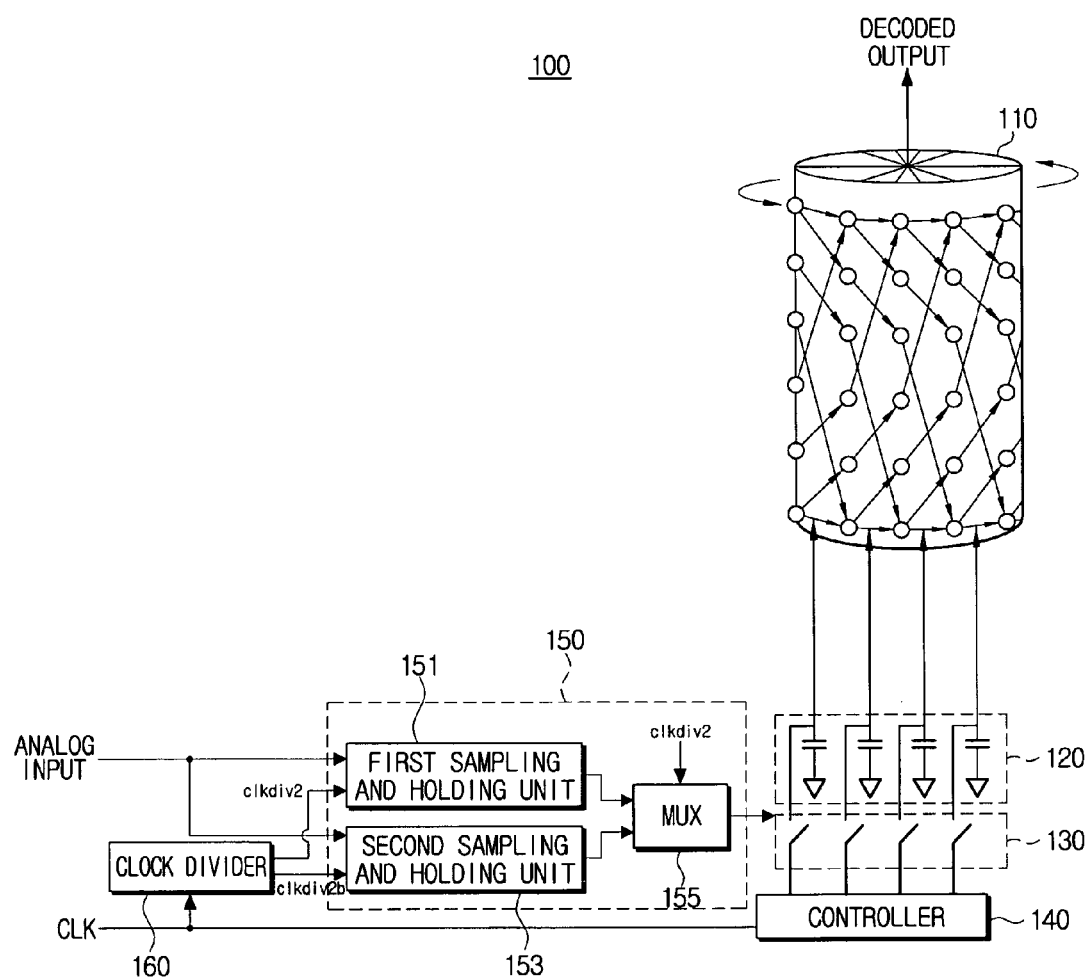
FIG. 3 is a block diagram of a Viterbi decoder according to an exemplary embodiment of the present invention.

FIG. 3 is a block diagram of a Viterbi decoder according to an exemplary embodiment of the present invention. Referring to FIG. 3, a Viterbi decoder 100 includes a decoder 110, an analog data storage 120, a first switching unit 130, a controller 140, an analog signal input unit 150, and a clock divider 160.

The decoder 110 includes a plurality of processing nodes that are sets of cells vertically disposed. The cells of the processing nodes are installed in positions corresponding to the processing nodes on a trellis diagram. Also, a last processing node of the processing nodes is connected to a first column to form a circular form. In this case, a number of cells constituting one processing node may vary depending on a shape of the Viterbi decoder.

The analog data storage 120 stores analog data input through the analog signal input unit 150. The analog data storage 120 may include a plurality of condensers.

The first switching unit 130 switches the operation of the analog data storage 120 storing the analog data. In a case where the analog data storage 120 includes the plurality of condensers as described above, the first switching unit 130 may include a plurality of switches respectively connected to the plurality of condensers.

The controller 140 designates signal processing nodes of the decoder 110 according to a clock signal CLK input from an external source. Also, the controller 140 controls the first switching unit 130 according to the clock signal CLK to sequentially store analog data sampled and held by the analog signal input unit 50 in the analog data storage 120.

The clock divider 160 outputs a first clock signal Clkdiv2 obtained by dividing a clock frequency of the clock signal CLK into ½ and a second clock signal Clkdiv2b obtained by inverting the first clock signal Clkdiv2.

The analog signal input unit 150 includes first and second sampling and holding units 151 and 153 and a multiplexer (MUX) 155.

The first sampling and holding unit 151 samples and holds analog data input from an external source according to the first clock signal Clkdiv2 and then transmits the analog data to the multiplexer 155. The second sampling and holding unit 153 samples and holds the input analog data according to the second clock signal Clkdiv2b and then transmits the input analog data to the multiplexer 155. Since the first and second sampling and holding units 151 and 153 sample and hold the input analog data according to the first and second clock signals Clkdiv2 and Clkdiv2b obtained by dividing the clock frequency of the clock signal CLK by ½, the time required for sampling and holding the analog data can be secured two times the time required for sampling and holding the analog data using one sampling and holding circuit. Thus, the analog data can be further precisely sampled.

The multiplexer 155 alternately outputs the analog data sampled and held by the first sampling and holding unit 151 and the analog data sampled and held by the second sampling and holding unit 153 using the first clock signal Clkdiv2 as a selection signal. For example, in a case where the first clock signal Clkdiv2 is on a high level, the multiplexer 155 may select and output the analog data sampled and held by the first sampling and holding unit 151. In a case where the first clock signal Clkdiv2b is on a low level, the multiplexer 155 may select and output the analog data sampled and held by the sampling and holding unit 153. In the present exemplary embodiment, the first clock signal Clkdiv2 is used as the selection signal, but the second clock signal Clkdiv2b may be used as a selection signal.

Figure 4:
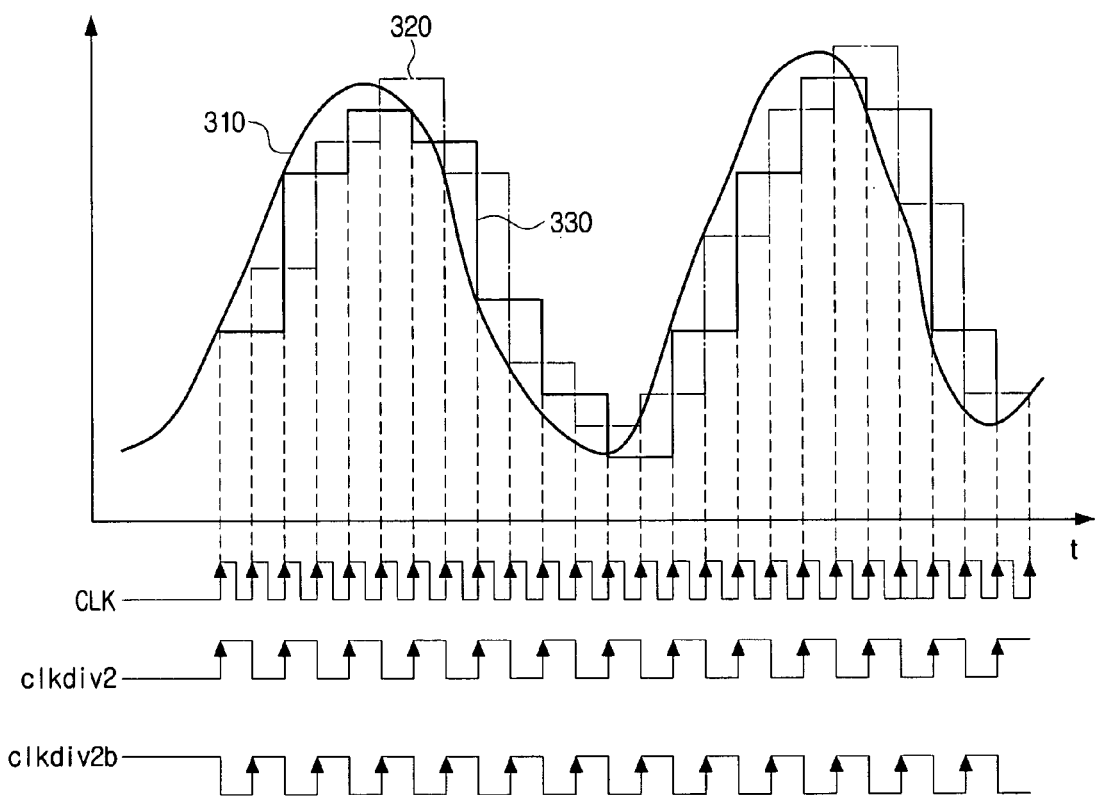
FIG. 4 is a view illustrating an operation of sampling and holding analog data via an analog signal input unit shown in FIG. 3 in detail.

FIG. 4 is a graph illustrating an operation of sampling and holding analog data via an analog signal input unit in detail.

Referring to FIGS. 3 and 4, if analog data 310 is input, the first sampling and holding unit 151 samples the analog data 310 at a rising edge of the first clock signal Clkdiv2 and then outputs the analog data 310 to the multiplexer 155, and the second sampling and holding unit 153 samples the analog data 310 at a rising edge of the second clock signal Clkdiv2b and then outputs the analog data 310 to the multiplexer 155.

If the first clock signal Clkdiv2 is on a high level, the multiplexer 155 selects and outputs analog data 320 sampled and held by the first sampling and holding unit 151. If the first clock signal Clkdiv2 is on a low level, the multiplexer 155 selects and outputs analog data 330 sampled and held by the second sampling and holding unit 153. Thus, the analog signal input unit 150 can output analog data equal to the analog data sampled and output through one sampling and holding circuit due to the clock signal CLK.

In the present exemplary embodiment, the analog signal input unit 150 includes the first and second sampling and holding units 151 and 153 but is not limited to this. An analog signal input unit according to the present invention may include more than two sampling and holding units in parallel and sequentially and alternately outputting analog data sampled by the sampling and holding units.

Figure 2:
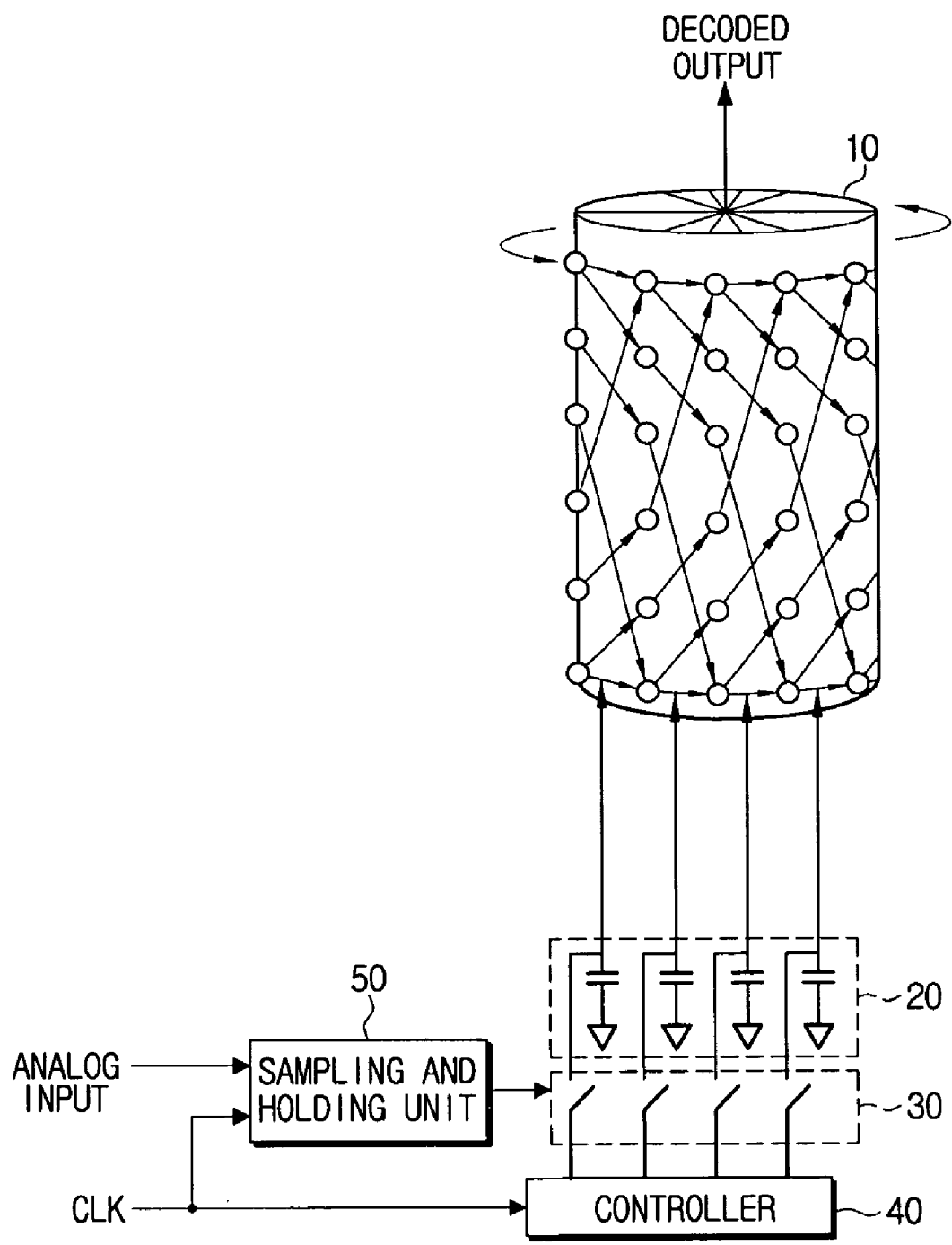
FIG. 2 is a schematic view illustrating a configuration of a conventional circular Viterbi decoder.
Figure 5:
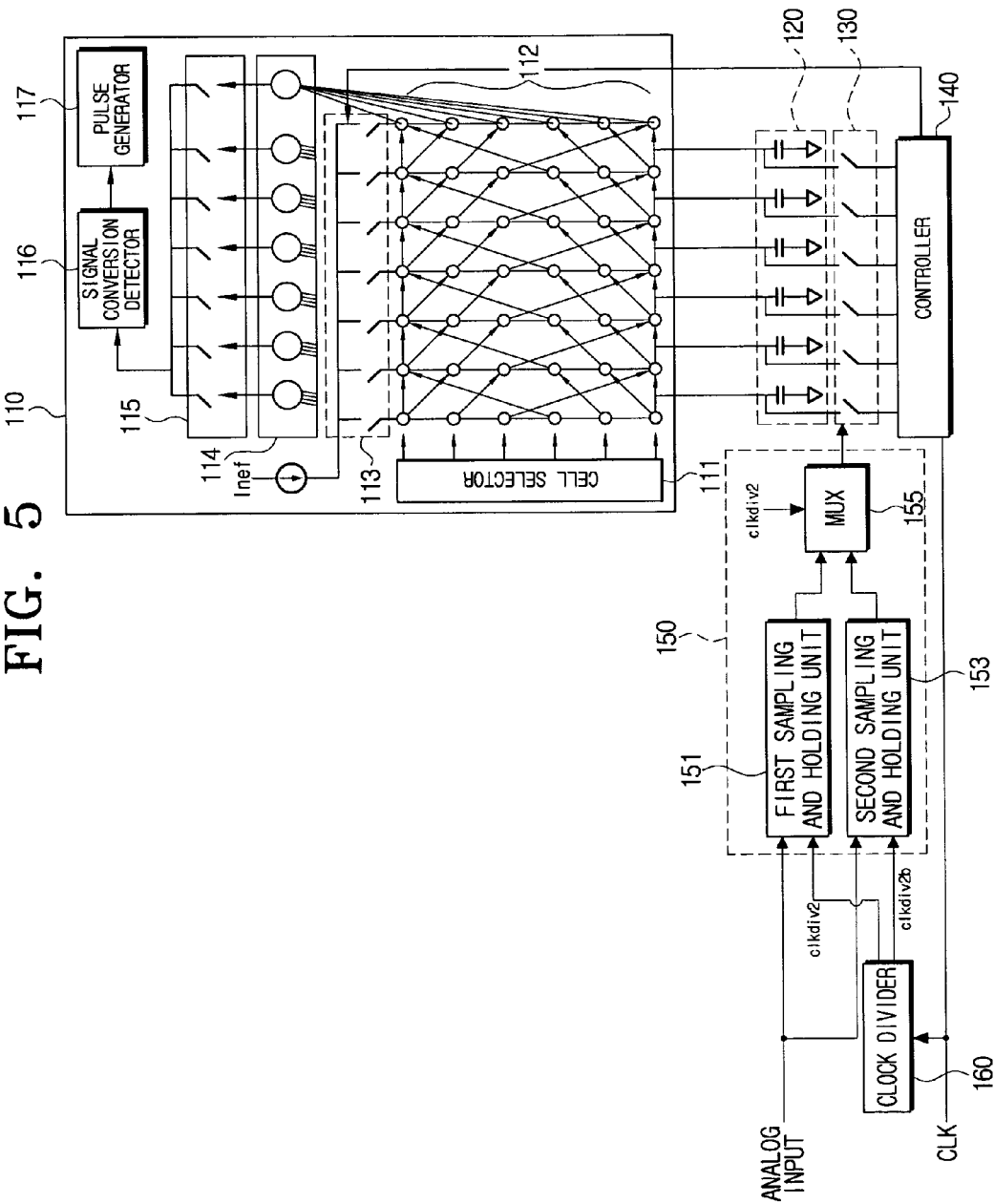
FIG. 5 is a view illustrating a detailed configuration of the Viterbi decoder shown in FIG. 2.

FIG. 5 is a detailed block diagram of the Viterbi decoder shown in FIG. 2. Referring to FIG. 5, the decoder 110 includes a cell selector 111, an analog signal processing cell 112, a second switching unit 113, a maximum value operator 114, a third switching unit 115, a signal conversion detector 116, and a pulse generator 117.

The analog signal processing cell 112 includes a plurality of processing nodes including a plurality of cells vertically disposed. The cells of the processing nodes are disposed in positions corresponding to the nodes of the trellis diagram. A last processing node of the plurality of processing nodes is connected to a first processing node. The processing nodes of the analog signal processing cell 112 may be longer than the constraint length of the trellis diagram by 1 or 2.

The cells of the analog signal processing cell 112 may reduce operation burdens by modifying Equation 1 above. In other words, if $y_{k,l}$ is defined as a value obtained from a subtraction of $D_{k,l}$ from a reference input signal $I_{ref}$ that is an arbitrary constant, Equation 1 is converted into Equation 2:

$$D_{i,j} = I_{ref} - \max\{y_{k,l} - d_{ij,lk};\ (k,l) \in S(i,j)\} \tag{2}$$

Since $y_{i,j}$ can be expressed as $I_{ref} - D_{i,j}$, $y_{i,j}$ can be substituted in Equation 2 to obtain Equation 3:

$$y_{i,j} = \max\{y_{k,l} - d_{ij,kl};\ (k,l) \in S(i,j)\} \tag{3}$$

According to Equation 3, an operator expression is changed from an addition and minimum value operation into a subtraction and maximum value operation. As shown in Equation 3, if a $(i,j)^{th}$ cell is a destination, a shortest distance $D_{i,j}$ from a cell corresponding to the destination to a cell corresponding to the destination is "0." In this case, $y_{i,j} = I_{ref} - D_{i,j}$, and thus $y_{i,j}$ becomes $I_{ref}$. Equation 3 is transformed in Equation 4 using this characteristic.

$$y_{i,j} = \max\{u_{i,j}, y_{k,l} - d_{ij,kl};\ (k,l) \in S(i,j)\}$$

$u_{i,j} = I_{ref}$; if (i,j) is cell of destination $$u_{i,j} = 0;\ \text{if } (i,j) \text{ is not cell of destination} \tag{4}$$

In other words, according to Equation 4, if the $(i,j)^{th}$ cell is a cell of a destination, a cell output value is $I_{ref}$. If the $(i,j)^{th}$ cell is not the cell of the destination, a maximum value of a subtraction result value is output.

The controller 140 designates the processing nodes of the analog signal processing cell 112 according to the clock signal CLK. In detail, if a current processing node is $j^{th}$, the controller 140 designates a $j+1^{th}$ processing node to a next input clock.

The cell selector 111 designates a predetermined cell of cells constituting the processing nodes designated by the controller 140. The cell selector 111 first designates an arbitrary cell. Next, if the designated cell performs an operation using Equation 4 above, the cell selector 11 determines a next cell using the result value of the operation.

The first switching unit 130 performs an switching operation to store analog input data in the condensers of the analog data storage 120. In this case, the first switching unit 130 stores data in a condenser connected to a previous processing node of the processing nodes designated by the controller 140. In other words, if the controller 140 designates a $j^{th}$ processing node, the first switching unit 130 conducts a switching connected to a condenser of a $j-1^{th}$ processing node to store analog data. If next data is input, the first switching unit 130 stores the next data in a condenser of a next processing node.

Thus, if analog data is stored in all of the condensers, the controller 140 controls the second switching unit 113 to supply a reference input signal to a predetermined cell.

If the cell receiving the reference input signal is determined by the controller 140 and the cell selector 111 as described above. In detail, if the reference input signal is applied to an $i^{th}$ cell of the $j^{th}$ processing node, i.e., the $(i,j)^{th}$ cell, the corresponding cell performs an operation using Equation 4. The controller 140 sequentially designates a next processing node, and the cell selector 111 designates a predetermined cell of cells constituting the next processing node using the operation result value of the $(i,j)^{th}$ cell. The reference input signal input to the $j^{th}$ processing node is propagated to the $j-1^{th}$ processing node in real-time. If the operation is performed up to the cells of the $j-1^{th}$ processing node, the maximum value operator 114 detects a maximum value of each of the cells.

The maximum value detected by the maximum value operator 114 is input to a rear node through the third switching unit 115. The third switching unit 115 performs a switching operation under the control the controller 140 so as to output a result of a current processing node.

In this state, the controller 140 adds a trigger signal in an opposite direction to the reference input signal to outputs of odd-numbered or even-numbered cells of cells of a next processing node. Thus, if an output signal of a corresponding cell is decreased, the output signal of the corresponding cell is intercepted by the next processing node. This is because the cell of the processing node selects a maximum value. If an optimum path for decoding passes an intercepted branch, a final output value is suddenly decreased due to the addition of the trigger signal. If the optimum path does not pass the intercepted branch, the final output value is kept as it is. Thus, a variation in the final output value can be checked to determine whether the optimum path passes a branch 0 or a branch 1.

The signal conversion detector 116 detects the variation in the final output value. Also, the pulse generator 117 checks the variation in the final output value detected by the signal conversion detector 116 so as to output a decoding result in the pulse signal form. Thus, input analog data is decoded.

Figure 6:
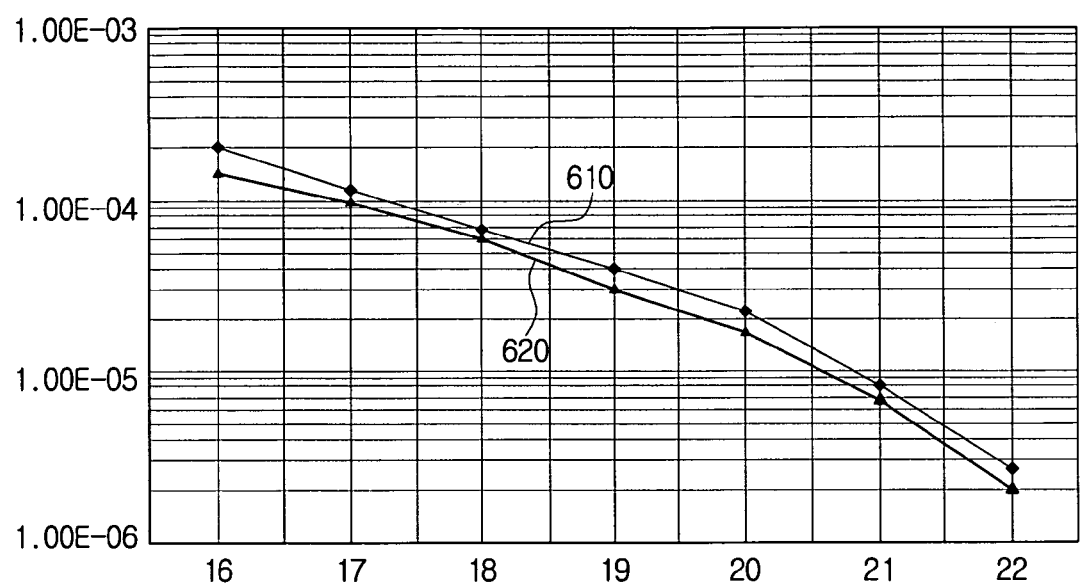
FIG. 6 is a graph illustrating decoding efficiency measured when a sampling and holding circuit is disposed in parallel according to an exemplary embodiment of the present invention.

FIG. 6 is a graph illustrating decoding efficiency using a sampling and holding circuit disposed in parallel according to an exemplary embodiment of the present invention.

The vertical axis of the graph shown in FIG. 6 denotes an intensity of noise expressed in decibels (dB), and the vertical axis of the graph denotes an error rate. A first line graph 610 denotes efficiency of decoding data at 400 Mbps using the conventional Viterbi decoder using one sampling and holding circuit, and a second line graph 620 denotes efficiency of decoding data at 400 Mbps using the Viterbi decoder of the present invention using sampling and holding circuits installed in parallel.

As shown in FIG. 6, when the intensity of the noise is 17 dB at the decoding speed of 400 Mbps, an error rate of the conventional Viterbi decoder exceeds $10^{-4}$ and thus does not satisfy the standards. However, an error rate of the Viterbi decoder of the present invention is $10^{-4}$ and thus satisfies the standards.

As described above, according to the present invention, a circular Viterbi decoder can remarkably improve a decoding speed without being limited by a sampling speed of a sampling and holding circuit.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. An analog Viterbi decoder, comprising:
   a clock divider which generates a plurality of clock signals by dividing a clock frequency of an externally-input clock signal;
   a plurality of sampling and holding units which sample and hold input analog data according to the clock signals generated from the clock divider;
   a multiplexer which directly inputs the data sampled and held from the plurality of sampling and holding units, and sequentially and alternately outputs the analog data sampled and held; and
   a decoder which comprises a plurality of processing nodes, each of the plurality of processing nodes comprising a plurality of cells vertically disposed so as to correspond to nodes on a trellis diagram, the decoder being configured to decode analog input data using an analog signal processing cell having a circular connection structure in which a last processing node of the plurality of processing nodes is connected to a first processing node.

2. The analog Viterbi decoder of claim 1, wherein the sampling and holding units comprise a first sampling unit and a second sampling unit parallel arranged with respect to the first sampling unit.

3. The analog Viterbi decoder of claim 2, wherein the clock divider generates a first clock signal by dividing the clock frequency into ½ and a second clock signal by inverting the first clock signal, and
   the first sampling and holding unit samples and holds the externally-input analog data according to the first clock signal, and the second sampling and holding unit samples and holds the externally-input analog data according to the second clock signal.

4. The analog Viterbi decoder of claim 3, wherein the multiplexer sequentially and alternately outputs the analog data sampled and held by the first and second sampling and holding units, according to one of the first and the second clock signals.

5. The analog Viterbi decoder of claim 1, wherein the decoder comprises:
   a cell selector which designates a predetermined cell of cells of a processing node designated by the controller;
   a second switching unit which are connected to each of the processing nodes of the analog signal processing cell so as to supply a reference input signal to the predetermined cell designated by the controller and the cell selector;
   a maximum value operator which detects a maximum value of output values of the cells if the cells of the designated processing node output predetermined operation values using the reference input signal and a value input from a previous processing node;
   a third switching unit which detects an output signal of the maximum value operator;

a signal conversion detector which monitors an output signal output from the third switching unit to detect a variation in the output value; and a pulse generator which outputs the variation in the output value detected by the signal conversion detector in a pulse signal form.

6. The analog Viterbi decoder of claim 5, wherein cells of a predetermined processing node of the decoder operate the output value using equations below:

$$y_{i,j} = \max\{u_{i,j}, y_{k,l} - d_{ij,kl}; (k,l) \in S(i,j)\}$$

$$y_{i,j} = I_{ref} - D_{i,j}$$

$u_{i,j} = I_{ref}$; if $(i,j)$ is cell of destination $u_{i,j} = 0$; if $(i,j)$ is not cell of destination wherein $y_{i,j}$ denotes an output value of a $(i,j)^{th}$ cell, $D_{i,j}$ denotes a shortest distance from the $(i,j)^{th}$ cell to a destination cell, $I_{ref}$ denotes a reference input signal value, $d_{ij,kl}$ denotes a partial distance from the $(i,j)^{th}$ cell to a $(k,l)_{th}$ cell, $S(i,j)$ denotes a set of cells belonging to a processing node to which the $(i,j)^{th}$ cell belongs, and max denotes a function outputting a maximum value.

* * * * *